United States Patent [19]
Cutter et al.

[11] Patent Number: 5,973,380
[45] Date of Patent: Oct. 26, 1999

[54] SEMICONDUCTOR JUNCTION ANTIFUSE CIRCUIT

[75] Inventors: Douglas J. Cutter; Kurt D. Beigel, both of Boise, Id.

[73] Assignee: Micron Technology, Inc., Boise, Id.

[21] Appl. No.: 09/206,775

[22] Filed: Dec. 7, 1998

Related U.S. Application Data

[62] Division of application No. 08/644,232, May 10, 1996, Pat. No. 5,847,441.

[51] Int. Cl.$^6$ ........................................... H01L 29/86
[52] U.S. Cl. ............................................. 257/530; 257/528
[58] Field of Search .............................. 257/529, 530, 257/390; 365/96; 327/502

[56] References Cited

U.S. PATENT DOCUMENTS

| | | | |
|---|---|---|---|
| 3,641,516 | 2/1972 | Castrucci et al. | 340/173 |
| 4,287,569 | 9/1981 | Fukushima | 365/96 |
| 4,376,984 | 3/1983 | Fukushima et al. | 365/104 |
| 4,538,167 | 8/1985 | Yoshino et al. | 357/59 |
| 4,727,409 | 2/1988 | Conner et al. | 357/59 |
| 4,783,763 | 11/1988 | Bergman | 365/94 |
| 4,961,102 | 10/1990 | Shideler et al. | 357/51 |
| 5,272,370 | 12/1993 | French | 257/353 |
| 5,379,250 | 1/1995 | Harshfield | 257/530 |
| 5,818,749 | 10/1998 | Harshfield | 365/105 |
| 5,847,441 | 12/1998 | Cutter et al. | 257/530 |
| 5,852,323 | 12/1998 | Conn | 257/530 |

*Primary Examiner*—David B. Hardy
*Attorney, Agent, or Firm*—Seed & Berry LLP

[57] ABSTRACT

An integrated semiconductor junction antifuse is formed from either adjacent regions of opposite doping types or spaced apart regions of similar doping type within a substrate. In its unblown state, the junction antifuse forms an open circuit that blocks current from flowing while in the blown state, the junction antifuse conducts current. The junction antifuse is blown by applying a breakdown voltage sufficient to overcome a semiconductor junction so that current flows across the reverse-biased semiconductor junction. As current flows across the reverse-biased junction, dopant migration forms a conductive path so that the junction antifuse no longer forms an open circuit.

7 Claims, 3 Drawing Sheets

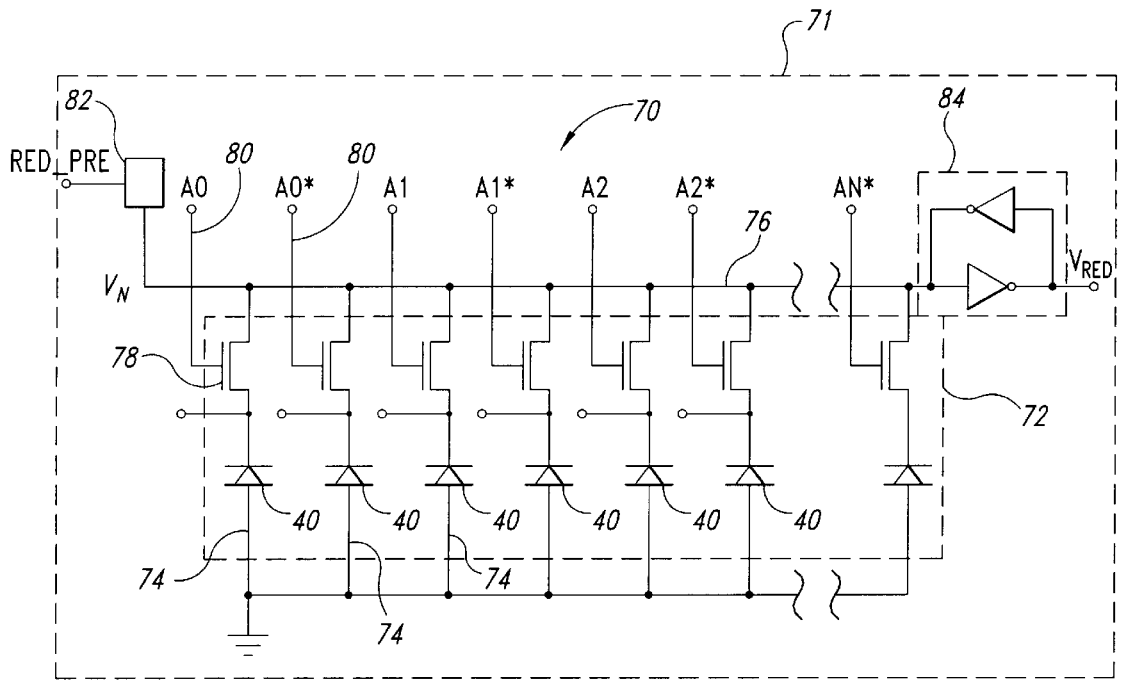
Fig. 5
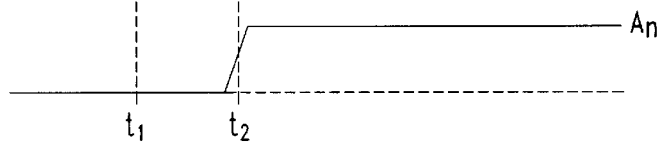

SEMICONDUCTOR JUNCTION ANTIFUSE CIRCUIT

CROSS-REFERENCE TO RELATED APPLICATION

This application is a divisional of U.S. patent application Ser. No. 08/644,232, filed May 10, 1996, now U.S. Pat. No. 5,847,441.

TECHNICAL FIELD

The present invention relates to antifuse circuits in integrated circuit devices.

BACKGROUND OF THE INVENTION

Typical integrated memory circuits include arrays of memory cells arranged in rows and columns. In many such integrated memory arrays, several redundant rows and columns are provided to be used as substitutes for defective locations in memory. When a defective bit location is identified, rather than treating the entire array as defective, a redundant row or column is substituted for the defective row or column. This substitution is performed by assigning the address of the defective row or column to the redundant row or column such that, when an address signal corresponding to the defective row or column is received, the redundant row or column is addressed instead.

To make substitution of the redundant row or column substantially transparent to a system employing the memory circuit, the memory circuit includes an address detection circuit. The address detection circuit monitors the row and column addresses and, when the address of a defective row or column is received, enables the redundant row or column instead.

One type of address detection circuit is a fuse-bank address detection circuit. Fuse-bank address detection circuits employ a bank of fuse based sense lines where each sense line corresponds to a bit of an address. The sense lines are programmed by blowing fuses in the sense lines in a pattern corresponding to the address of the defective row or column. Addresses are then detected by first applying a test voltage across the bank of sense lines. Then, bits of the address are applied to switches in the sense lines. If the pattern of blown fuses corresponds exactly to the pattern of address bits, the sense lines all block current and the voltage across the bank remains high. Otherwise, at least one sense line conducts and the voltage falls. A high voltage thus indicates the programmed address has been detected. A low voltage indicates a different address has been applied.

Typically, the fuses are blown by laser cutting the fuse conductors to remove the conductive paths through the fuses. One problem with such an approach is that laser cutting of the fuses is time consuming, difficult, and imprecise. As a consequence, the cost and reliability of memory devices employing fuse bank circuits can be less than satisfactory.

To eliminate the cost, difficulty, and expense of laser cutting, memory devices have recently been developed that employ antifuses in place of conventional fuses. Typical antifuses are parallel-plate capacitive structures that, in their unblown states, form open circuits. Such antifuses are "blown" by applying a high voltage across the antifuse. The high voltage causes a dielectric region of the parallel-plate capacitive structure to break down, forming a conductive path through the antifuse. Therefore, blown antifuses conduct and unblown antifuses do not conduct.

Parallel-plate capacitive antifuses can consume significant amounts of surface area on an integrated circuit die. Moreover, parallel-plate capacitive antifises can require different sequences of processing steps from the processing steps for fabricating the remainder of the integrated circuit die. Consequently, the space consumption and processing incompatibility of antifuses can make antifuses an undesirable alternative to the fuses.

SUMMARY OF THE INVENTION

A junction antifuse is formed by one or more reverse-biased semiconductor junctions. In one embodiment of the invention, two n+ regions are spaced apart in a p-type substrate with a small section of the p-type substrate therebetween. Input and output conductors coupled to each of the n+ regions provide signal lines for application of electrical signals to the n+ regions.

If a positive input voltage is applied to one of the n+ regions, the junction between the n+ region and the p-type substrate is reverse-biased, blocking any current from flowing. If, however, the input voltage is sufficiently high, it breaks down the reverse-biased junction, causing current flow. Continuous application of the high voltage causes continuous current flow that, in turn, causes carrier migration through the gap between the n-wells. As carriers migrate through the gap, they produce a conductive path extending between the n-wells. Once the conductive path is formed, the integrated structure no longer forms an open circuit and the junction antifuse is "blown." Thus, the unblown junction antifuse forms an open circuit and the blown antifuse forms a conductive path.

In a second embodiment of the invention, the junction antifuse is formed by adjacent n+ and p+ regions in an n-well. The n+ and p+ regions are highly doped, having an abrupt junction boundary with a relatively low breakdown voltage. The p+ region is connected to an input line and the n+ region is connected to a reference potential. If a positive voltage is applied to the n+ region, the junction between the p+ and n+ regions forms an open circuit, blocking current flow. A sufficiently high voltage to break down the reverse-biased p-n junction causes current to flow from the n+ region to the p+ region Continuous application of the high voltage causes continuous current flow that, in turn, causes carrier migration producing a conductive path. The conductive path effectively bypasses the reverse-biased p-n junction and the junction antifuse conducts.

In one embodiment, the junction antifuse is incorporated within a conventional fuse bank circuit in place of conventional antifuses. Then, selected ones of the junction antifuses are blown in a pattern corresponding to a selected address. If the pattern of bits of an input address corresponds to the pattern of blown junction antifuses, the fuse bank circuit provides an output signal to activate a redundant row in place of a defective row.

In another embodiment, junction antifuses are incorporated within an integrated circuit package as part of a mode select circuit. In the unblown state, the junction antifuse blocks a positive voltage from reaching a mode select input of an integrated device and the integrated device operates in a first mode. In its blown state, the junction antifuse conducts the positive voltage to the mode select input of the integrated device and the integrated device operates in a second mode.

BRIEF DESCRIPTION OF THE DRAWINGS

FIG. 5 is a schematic of a redundant row detection circuit employing a bank of semiconductor junction antifuses.

FIGS. 6A-6B are signal diagrams presenting signals at selected points in the detection circuit of FIG. 5.

DETAILED DESCRIPTION OF THE INVENTION

Figure 1:
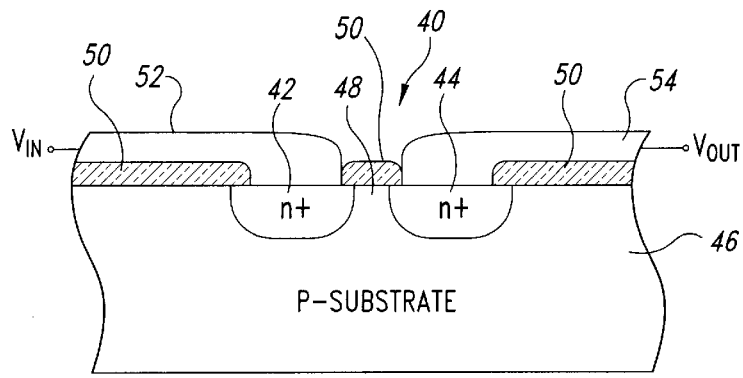
FIG. 1 is a side cross-sectional view of a first the semiconductor junction antifuse incorporating spaced-apart n+ regions.

As shown in FIG. 1, a semiconductor junction antifuse 40 is formed from a pair of n+ regions 42, 44 closely spaced in a p-type substrate 46. A narrow section of the p-type substrate 46 forms a barrier region 48 separating the n+ regions 42, 44.

A thick oxide layer 50 covers the substrate 46 to protect and insulate the substrate 46. A conductive input line 52 overlays the oxide layer 50 and extends through a via to provide electrical contact to the left n+ region 42. Similarly, a conductive output line 54 overlays the oxide layer 50 and extends through a via to provide electrical contact to the right n+ layer 44.

If an input voltage $V_{in}$ is applied between the input line 52 and the output line 54, the left n+ region 42 is biased with respect to the right n+ region 44. If the input voltage $V_{in}$ is greater than zero, the interface between the left n+ region 42 and the substrate 46 forms a reverse-biased p-n junction. As is known, reversed biased p-n junctions present substantially open circuits. Thus, if the input voltage $V_{in}$ is greater than zero, no current will flow across the reversed biased p-n junction.

If the input voltage $V_{in}$ is less than zero, the interface between the right n+ region 44 and the substrate 46 forms a reverse-biased p-n junction. Once again no current flows. Consequently, a voltage differential between the n+ regions 42, 44 causes no current flow between the input and output lines 52, 54. The junction antifuse 40 essentially forms an open circuit to block current flow between the input line 52 and the output line 54.

Figure 2:
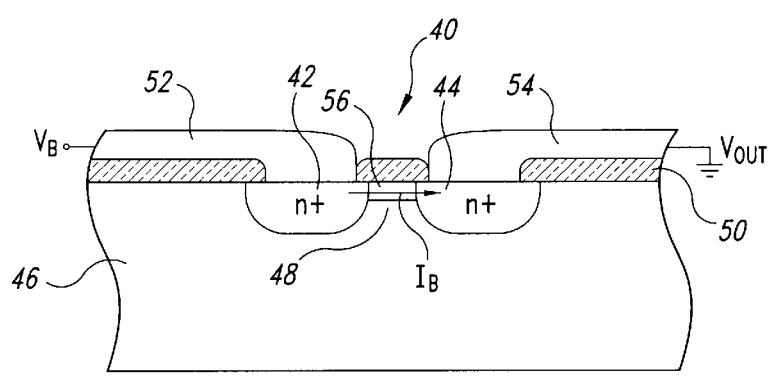
FIG. 2 is a side cross-sectional view of the semiconductor junction antifuse of FIG. 1 after blowing showing a conductive region extending between the n+ regions.

FIG. 2 shows the junction antifuse of FIG. 1 in a "blown" state. The blown junction antifuse 40 of FIG. 2 differs from the unblown junction antifuse of FIG. 1 in that the blown junction antifuse 40 of FIG. 2 includes a conductive region 56 extending across the barrier region 48. The conductive region 56 provides a current path between the n+ regions 42, 44, bypassing the reverse-biased p-n junction, described above. Thus, the blown junction antifuse 40 conducts current while the unblown junction antifuse 40 (FIG. 1) blocks current flow. The junction antifuse 40 thus has analogous electrical characteristics to a conventional antifuse.

The junction antifuse 40 is blown, i.e., converted from the structure of FIG. 1 to the structure of FIG. 2, by inducing dopants to migrate between the n+ regions 42, 44 and the barrier region 48 thereby forming the conductive region 56. In one method of inducing dopant migration, a current-limited breakdown voltage $V_B$ is applied to the input line 52. The breakdown voltage $V_B$ is high enough to overcome the reversed biased p-n junction between the left n+ region 42 and the barrier region 48 such that a current $I_B$ flows across the barrier region 48. To prevent high currents from destroying the device, the current $I_B$ is limited to a maximum value.

The current $I_B$ flowing through the barrier region 48 causes dopant migration in the barrier region 48, eventually forming the conductive region 56 crossing the barrier region 48. When the resistance between the input line 52 and the output line 54 drops below a selected value where the junction antifuse 40 is considered to be blown, the breakdown voltage $V_B$ is removed.

Preferably, the n+ regions 42, 44 are highly doped with an abrupt junction such that the p-n junctions between the regions 42, 44 and the barrier region 48 have a lower breakdown voltage $V_B$ than that of conventional p-n junctions elsewhere in the integrated circuit. Thus, when the breakdown voltage $V_B$ is applied to the junction antifuse 40, no current flows through other p-n junctions in the integrated circuit. This allows the junction antifuse 40 to be blown without damaging other integrated elements in the memory device 71.

Figure 3:
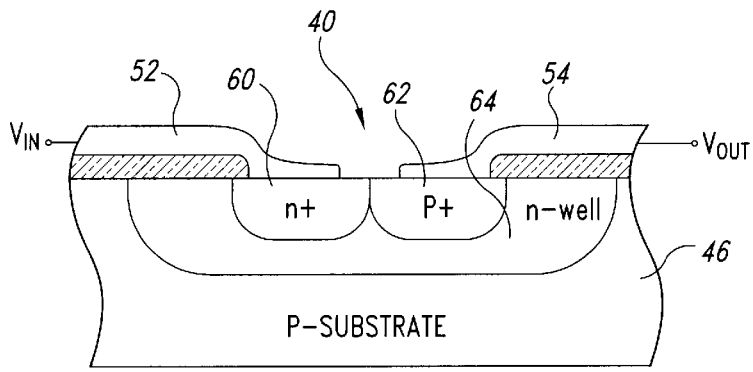
FIG. 3 is a cross-sectional view of a second embodiment of the semiconductor junction antifuse including adjacent regions of opposite doping type.
Figure 4:
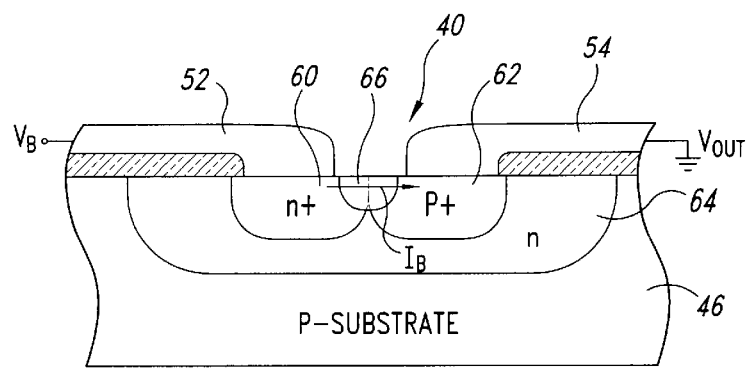
FIG. 4 is a side cross-sectional view of the semiconductor junction antifuse of FIG. 3 after blowing showing a conductive interstitial region.

An alternative embodiment of an unblown junction antifuse 40, shown in FIG. 3, incorporates an n+ region 60 and a p+ region 62 in an n-well 64 formed in the p+ substrate 46. As with the embodiment of FIG. 1, the input and output lines 52, 54 allow electrical connection to the regions 60, 62.

As is known, the junction between the n+ and p+ regions 60, 62 prevents current from flowing from the n+ region 60, to the p+ region 62, although current can flow in the opposite direction. The unblown junction antifuse 40 thus forms a unidirectional barrier to current flow from the input line 56 to the output line 54.

The junction antifuse 40 of FIG. 3 is blown in the same fashion as the junction antifuse 40 of FIGS. 1 and 2. A current limited, high breakdown voltage $V_B$ is applied to the input line 52 to break down the junction, causing the current $I_B$ to flow. The current $I_B$ causes dopant diffusion, producing a conductive interstitial region 66 between the n+ region 60 and the p+ region 62. The interstitial region 66 forms a transitional region between the n+ region 60 and the p+ region 62 that bypasses the p-n junction and conducts current bidirectionally. Thus, the blown junction antifuse 40 is a bidirectional current flow element.

As with the n+ regions 40, 42 of FIG. 1, the n+ region 60 and p+ region 62 are highly doped with an abrupt junction. The breakdown voltage $V_B$ of the abrupt junction is lower than the breakdown voltages of other p-n junctions in the integrated device. Thus, the junction antifuse 40 can be blown without damaging other elements within the integrated device.

FIG. 5 shows one exemplary application of the junction antifuses 40 which can incorporate either of the above-described embodiments. As shown in FIG. 5, a redundant row address detection circuit 70 within a memory device 71 incorporates a bank of junction antifuses 40. The address detection circuit 70 includes a fuse bank 72 formed from several fuse lines 74 coupled to a common node 76. Each of the fuse lines 74 includes a corresponding junction antifuse 40 serially connected with a line select transistor 78 between the common node 76 and a reference potential, such as ground. The gate of each line select transistor 78 is controlled by a respective address line 80 with the address lines grouped in complementary pairs. That is, the first two address lines 50 are the A0 and A0* lines corresponding to the first bit of an address and the logical complement of the first bit, respectively. Address bits on the address lines are typically provided by a conventional memory address decoder (not shown) in response to a row address select signal RAS.

A precharge circuit 82 and an output buffer 84 are also connected to the common node 76. The precharge circuit 82 selectively applies a precharge voltage to the common node 76 and the buffer circuit 84 provides a high impedance output buffer to isolate the common node 76 from loads.

The operation of the address detection circuit 70 is best explained in conjunction with FIGS. 6A-6B. As shown in FIG. 6A, at time $t_1$ the precharge circuit 82 precharges the common node 76 to a test voltage $V_N$. However, since all of the line select transistors 78 are OFF at that time, substantially no current flows through the fuse lines 74. The voltage $V_N$ at the common node 76 thus remains at the test voltage. At a later time $t_2$, after precharging, one bit of a row address is applied to each of the address select lines 80, as represented in FIG. 6B. It will be understood that only one of the address select lines 80 in each complementary pair will go high. For example for the first pair A0, A0* of address lines 50, the first address line (the A0 line) will go high if the first bit of the row address is a "1," turning ON the corresponding line select transistor 78. In this case, the second address line 50 (the A0* line) will be a "0," turning OFF the second line select transistor 78. Alternatively, if the first bit of the row address is a "0," the second complementary address select line 50 (the A0* line) will go high, turning ON the corresponding line select transistor 78. Meanwhile, the first line select transistor 78 (corresponding to the A0 line) will be OFF.

Before the above-described operation, the junction antifuses 40 corresponding to the complements of the bits of a defective row's address are blown in the manner described above. The remaining junction antifuses 40 are left unblown. Thus, only the fuse lines 74 corresponding to the complements of the bits of the defective row's address contain junction antifuses 40 that are blown. Each complementary pair of fuse lines 74 corresponds to one bit of the row address, and each junction antifuse 40 in the complementary pair corresponds to one state of the bit. Consequently, one junction antifuse 40 in each pair of fuse lines 74 will be blown and one junction antifuse 40 will be unblown. Thus, when the address bits are applied to respective line select transistors 78, if the bits of the row address do not correspond exactly to the blown fuses 40, at least one of the fuse lines 74 will include a blown junction antifuse 40. Thus, when a line select transistor 78 for the blown fuse is turned ON, the fuse line 74 forms a conductive path between the common node 76 and the reference potential, thereby pulling the node voltage $V_N$ down, as indicated by the broken line in FIG. 6A. The low node voltage $V_N$ indicates that the decoded address corresponds to the address of an operational row.

If the bits of the row address correspond exactly to the unblown junction antifuses 40, every fuse line 74 will contain either a line select transistor 78 that is OFF or an unblown junction antifuse 40. In each case, the fuse line 74 forms an open circuit, isolating the node 76 from the reference potential. Consequently, the node voltage $V_N$ remains high indicating that the address is for a defective row. In response, a redundant row within the memory circuit 71 is substituted for the defective row.

Figure 7:
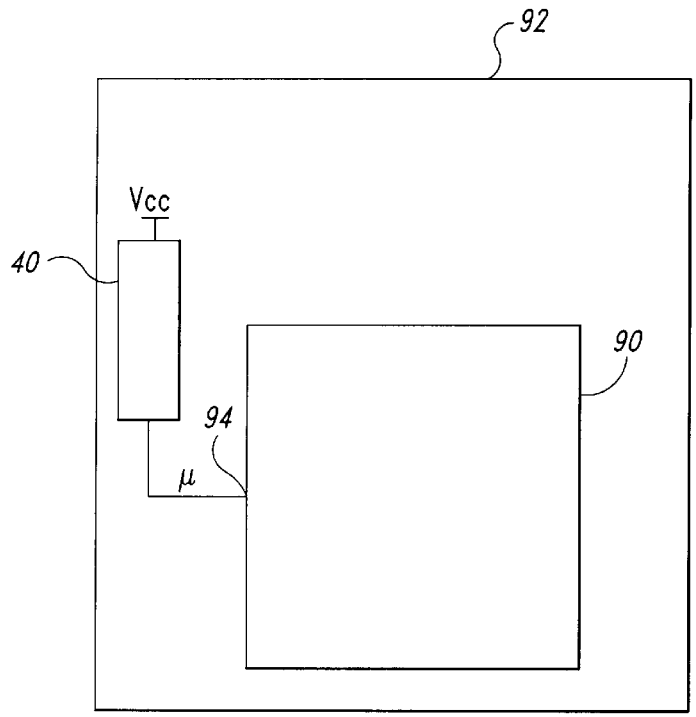
FIG. 7 is a block diagram of an integrated circuit package incorporating a semiconductor junction antifuse and a mode select circuit.

FIG. 7 shows an embodiment of an integrated circuit package 92 in which the junction antifuse 40 controls mode selection of an integrated device 90. Within the package 92, the junction antifuse 40 is coupled between a supply voltage $V_{cc}$ and a mode select input 94 of the integrated circuit 90. Preferably, the junction antifuse 40 and integrated circuit 90 are integrated in or on a common substrate. To ensure that the programming of the junction antifuse 40 does not damage the integrated circuit 90, the junction antifise 40 is doped with high levels of dopants to form an abrupt junction having a lowered breakdown voltage $V_B$.

If the junction antifuse 40 is blown, the junction antifuse 40 couples the supply voltage $V_{cc}$ directly to the mode select input 94. In response to the high voltage $V_{cc}$ at the mode select input 94, the integrated circuit 90 operates in a first mode. For example, if the integrated device 90 is a multiple latency synchronous device, a high input voltage at the mode select input 94 would cause the integrated device 90 to operate in a first latency mode, such as two-latency.

If, on the other hand, the antifuse 40 is unblown, the mode select input 94 is isolated from the supply voltage $V_{cc}$ and thus floats. In response, the integrated circuit 90 operates in a second mode that is different from the first mode. For example, if the integrated circuit 90 is a multiple latency synchronous device, the integrated circuit 90 may operate in the second latency mode, such as three-latency.

While the block diagram of FIG. 7 shows the junction antifuse 40 coupled directly between the supply voltage $V_{cc}$ and the mode select input 94, one skilled in the art will recognize various other structures incorporating the invention. For example, the mode select input 94 may be referenced to ground through a high impedance, such as a long channel FET. Similarly, the junction antifuse 40 may be incorporated within a detection circuit that produces a high or low output voltage depending upon the state of the antifuse. Then, the output of the detection circuit would drive the mode select input 94. Also, although the integrated circuit has been described as a multiple latency synchronous DRAM, various other integrated circuit structures having multiple modes or options would be within the scope of the invention.

Figure 8:
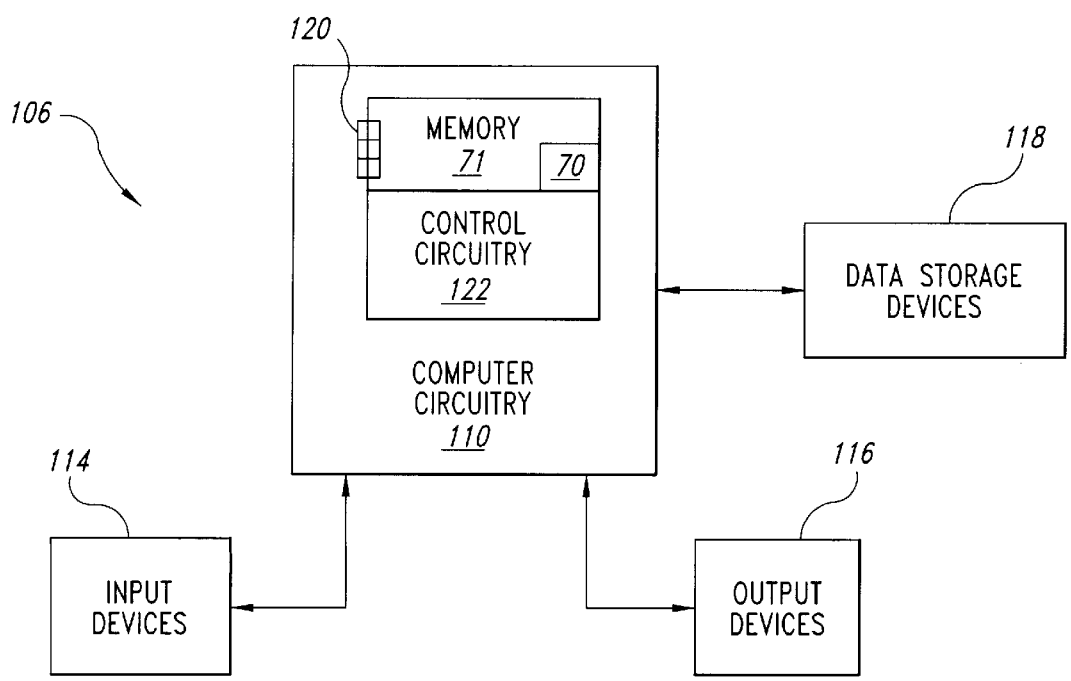
FIG. 8 is a block diagram of a computer system including an integrated circuit incorporating a semiconductor junction antifuse according to the invention.

FIG. 8 is a block diagram of a computer system 106 employing the memory device 71 that contains the junction antifuse 40 within the address detection circuit 70 of FIG. 2. The computer system 106 includes computer circuitry 110 for performing computer functions such as executing software to perform desired calculations and tasks. The circuitry 110 typically contains a processor (not shown) and the memory device 71 as shown.

One or more input devices 114, such as a keypad or a mouse, are coupled to the circuitry 110 to display or otherwise output data generated by the computer circuitry 110. Examples of output devices include a printer and a video display unit. One or more data storage devices 118 are coupled to the computer circuitry 110 to store data on retrieve data from external storage media (not shown). Examples of storage devices 118 and storage media include drives that accept hard and floppy disks, tape cassettes, and compact-disk read-only memories. The computer circuitry 110 also includes control circuitry 122 that produces the signals described above for input to the address detection circuit 70 of FIG. 5.

While a specific embodiment of the invention has been described herein for purposes of illustration, various modifications may be made without deviating from the spirit and scope of the invention. For example, the integrated circuit package 92 of FIG. 7 may be incorporated within the computer system 106 of FIG. 8 instead of, in addition to or as part of, the memory device 71 containing the address detection circuit 70. of FIG. 2. Accordingly, the invention is not limited except as by the appended claims.

We claim:

1. An integrated antifuse in an integrated circuit device, the integrated circuit including a plurality of integrated elements having respective semiconductor junctions, wherein substantially all of the semiconductor junctions have a breakdown voltage above a minimum breakdown voltage, comprising:

a substrate of a first doping type having a well of a second doping type that is different from the first doping type;

a first region of the first doping type formed in the well of the substrate; and a second region of the second doping type formed in the well of the substrate and adjacent the first region, the doping levels of the first and second regions being selected to form a junction having a breakdown voltage below a selected breakdown voltage, wherein the selected breakdown voltage is less than the minimum breakdown voltage.

2. The antifuse of claim 1 wherein the antifuse includes a third region of the second doping type spaced apart from the second region of the second doping type with a portion of the first region of the first doping type positioned between the second and third regions.

3. An integrated antifuse in an integrated circuit device, the integrated circuit including a plurality of integrated elements having respective semiconductor junctions, wherein substantially all of the semiconductor junctions have a breakdown voltage above a minimum breakdown voltage, comprising:

a substrate of a first doping type;

a well of a second doping type different from the first doping type formed in the substrate;

a first region of the first doping type formed in the well:

a second region of a second doping type formed in the well adjacent the first region, the doping levels of the first and second regions being selected to form a junction having a breakdown voltage below a selected breakdown voltage, wherein the selected breakdown voltage is less than the minimum breakdown voltage;

a third region of the first doping type formed in the well and spaced apart from the first region of the first doping type with a portion of the second region of the second doping type positioned between the first and third regions.

4. An integrated circuit device, comprising:

a first plurality of semiconductor junctions having a first breakdown voltage; and a second plurality of semiconductor junctions accessible for use as a fuse bank, the semiconductor junctions in the second plurality of semiconductor junctions having a second breakdown voltage lower than the first breakdown voltage.

5. The integrated circuit device of claim 4 wherein the second plurality of semiconductor junctions are coupled between a test node and a reference potential.

6. The integrated circuit device of claim 5, further including a precharge circuit coupled to the test node.

7. An integrated circuit package, comprising:

an integrated device integrated into a substrate of a first doping type and having a plurality of integrated elements having respective semiconductor junctions, wherein substantially all of the semiconductor junctions have a breakdown voltage above a minimum breakdown voltage, the integrated device having a mode control input, the integrated device operating in a first operational mode in response to a first voltage at the mode select input and operating in a second mode in response to a second voltage at the mode select input;

a biasing voltage terminal; and a semiconductor junction antifuse coupled between the biasing voltage and the mode select input, the junction antifuse including:

a first region of the first doping type in the substrate; and a second region of a second doping type different from the first type in the substrate and adjacent the first region, the doping levels of the first and second regions being selected to form a junction having a breakdown voltage below the minimum breakdown voltage, the doping levels of the first and second regions being higher than substantially all other doping levels within the integrated device.

* * * * *

UNITED STATES PATENT AND TRADEMARK OFFICE
CERTIFICATE OF CORRECTION

PATENT NO. : 5,973,380
DATE : October 26, 1999
INVENTORS : Cutter et al.

It is hereby certified that error appears in the above-identified patent and that said Letters Patent are hereby corrected as shown below:

Column 2, line 65        reads "a first the"        should read - - a first embodiment of the - -

Signed and Sealed this

Twenty-second Day of May, 2001

*Attest:*

NICHOLAS P. GODICI

*Attesting Officer*      *Acting Director of the United States Patent and Trademark Office*